United States Patent
Oswald

(10) Patent No.: US 8,212,583 B2
(45) Date of Patent: Jul. 3, 2012

(54) METHOD AND SYSTEM FOR TESTING YAWING SYSTEM FOR WIND TURBINE

(75) Inventor: Donald J. Oswald, Richland, WA (US)

(73) Assignee: Siemens Aktiengesellschaft, München ( * ) Notice: Subject to any disclaimer, the term of this patent is extended or adjusted under 35 U.S.C. 154(b) by 398 days.

(21) Appl. No.: 12/533,268

(22) Filed: Jul. 31, 2009

(65) Prior Publication Data

US 2011/0025370 A1    Feb. 3, 2011

(51) Int. Cl.
*G01R 31/34* (2006.01)
*H01F 27/00* (2006.01)

(52) U.S. Cl. .............. 324/765.01; 324/555; 336/107

(58) Field of Classification Search ........ 324/764.01–765.01; 336/107
See application file for complete search history.

(56) References Cited

U.S. PATENT DOCUMENTS

| | | | | |
|---|---|---|---|---|
| 6,176,675 B1 * | 1/2001 | Engstrom | ............... | 415/4.3 |
| 7,642,748 B2 * | 1/2010 | Glosser et al. | ............... | 320/116 |
| 2008/0266400 A1 | 10/2008 | Lu | | |
| 2008/0307647 A1 | 12/2008 | Kessler | | |
| 2009/0004009 A1 | 1/2009 | Egedal | | |
| 2009/0016227 A1 | 1/2009 | Lin | | |
| 2009/0039651 A1 | 2/2009 | Stiesdal | | |
| 2009/0051222 A1 | 2/2009 | Schellings | | |
| 2009/0100918 A1 | 4/2009 | Cires | | |
| 2009/0129931 A1 | 5/2009 | Stiesdal | | |

FOREIGN PATENT DOCUMENTS

| | | |
|---|---|---|
| DE | 20217795 U1 | 2/2003 |
| EP | 2009279 A1 | 12/2008 |
| EP | 2065901 A2 | 6/2009 |
| FR | 864248 | 4/1941 |
| JP | 08331712 A | 12/1996 |

* cited by examiner

*Primary Examiner* — Jermele M Hollington
*Assistant Examiner* — Emily Chan

(57) ABSTRACT

A system and method is provided for ground testing of a yaw system of a nacelle (3) prior to erection of a wind turbine (1). A portable transformer box (10) is provided which will allow the nacelle preparation team to operate the yaw and hydraulic systems while the nacelle is grounded prior to erection.

8 Claims, 4 Drawing Sheets

METHOD AND SYSTEM FOR TESTING YAWING SYSTEM FOR WIND TURBINE

FIELD OF THE INVENTION

The disclosure generally relates to wind turbines and, more particularly to ground testing of a yawing system of a wind turbine prior to erection.

BACKGROUND OF THE INVENTION

A wind turbine comprises several components including a tower, a nacelle, a generator, a rotor comprising a hub and rotor blades and so on. Yaw systems are conventionally used in wind power stations to yaw the turbine nacelle to the required angle against the wind. When a wind turbine is erected, the blades, the hub, the tower and the nacelle are transported to the site of erection. The tower is erected, the nacelle is mounted on the tower, the hub is mounted on the nacelle and the rotor blades are attached to the hub by means of at least one crane. When erected on land, normally mobile cranes are used to position, orient and arrange the components relatively to each other so that the components are able to be mounted together. During this erection phase in wind turbine construction, it is also necessary to yaw the nacelle while mounting the rotor and again, post lifting, to allow the crane to track unobstructed to the next site. As in any other physical systems, faults/failures may occur in the system. Specifically, if there are any failures with the yaw system during the erection phase, costly standstills of manpower and equipment will result.

In order to operate and test the yaw and hydraulic systems, specific voltages must be supplied to the nacelle. Unfortunately, yaw failures can only be detected after the nacelle is erected on the tower because the required voltages are not available on the ground.

Wind turbines, yaw controls, and testing systems are well known in the art, including those described in US Patent and Application Nos. 2009/0100918, 2009/0016227, 2008/0266400, 2008/0307647, 2009/0004009, 2009/0039651, 2009/0129931, each of which is incorporated herein by reference.

SUMMARY OF THE INVENTION

Systems and methods for ground testing yaw systems of wind turbines are provided. In this regard, an exemplary embodiment of system for ground testing yaw systems of wind turbines, a portable transformer box is provided which will allow the nacelle preparation team to operate the yaw and hydraulic systems while the nacelle is grounded prior to erection.

In a first embodiment, the invention is a system for ground testing a yaw system of a wind turbine, comprising: a portable transformer device comprising a step down transformer, a case for enclosing the step down transformer, a first input voltage connection for receiving a first input voltage from a generator, a second output voltage connection for providing a second output voltage equal to the first input voltage of the generator, and a third stepped down output voltage connection for providing a third stepped down output voltage, wherein the step down transformer converts the first input voltage of the generator to the third stepped down output voltage, wherein the second output voltage connection and the third stepped down output voltage connection are adapted to be connected to a nacelle of a wind turbine for providing the necessary power for testing the yaw system while the nacelle is grounded prior to erection.

In a further embodiment, the first input voltage is approximately 690 VAC, the second output voltage is approximately 690 VAC, and the third stepped down output voltage is approximately 400 VAC. The generator for provides 690 VAC. In a further embodiment, a controller is provided that has a communication link adapted for connection to the nacelle to control the yaw system. The case may include ventilation and one or more handles for transporting the portable transformer device. The yaw system has status lights that indicate the yaw system is operational.

In a second embodiment, the invention is a system for ground testing a yaw system of a wind turbine that also includes the controller. This embodiment has a portable transformer device comprising a step down transformer, a controller having a communication link adapted for connection to a nacelle of a wind turbine to control a yaw system, a case for enclosing the step down transformer and the controller, a first input voltage connection for receiving a first input voltage from a generator, a second output voltage connection for providing a second output voltage substantially equal to the first input voltage of the generator, and a third stepped down output voltage connection for providing a third stepped down output voltage, wherein the step down transformer converts the first input voltage of the generator to the third stepped down output voltage, wherein the second output voltage connection and the third stepped down output voltage connection are adapted to be connected to the nacelle of the wind turbine for providing the necessary power for testing the yaw system while the nacelle is grounded prior to erection.

The invention also includes a method for ground testing a yaw system of a wind turbine, comprising the following steps: (a) connecting a portable transformer device to a generator having a first output voltage provided by a first output voltage connection, wherein an input voltage connection of the portable transformer device is connected to the first output voltage connection of the generator, and wherein the portable transformer device provides a second output voltage by a second output voltage connection equal to the first output voltage of the generator and a third stepped down output voltage by a third stepped down output voltage connection; (b) connecting the second output voltage connection of the portable transformer device and the third stepped down output voltage connection to a nacelle of the wind turbine; (c) connecting a controller to the nacelle for controlling a yaw system of the nacelle; (d) powering on the generator to provide the first output voltage from the generator; (e) receiving by the portable transformer device the output voltage from the generator, providing the output voltage of the generator to the second output voltage connection and stepping down the output voltage from the generator to provide the third stepped down output voltage connection to the nacelle of the wind turbine; (f) energizing the yaw system, such that the yaw system receives the second output voltage and the third stepped down output voltage from the portable transformer device; and (g) outputting an indication to status lights of the yaw system to indicate that the yaw system is operational.

In an embodiment, the first input voltage is approximately 690 VAC, the second output voltage is approximately 690 VAC, and the third stepped down output voltage is approximately 400 VAC and the generator provides 690 VAC. The method may further include connecting an output signal that indicates that the yaw system is operational to a reporting device or an alarm device. The method may further include visually inspecting the status lights to confirm that the yaw system is operational, visually inspecting the nacelle for movement to confirm that the yaw system is operational, and/or receiving an indication of movement of the nacelle to confirm that the yaw system is operational.

Other systems, methods, features and/or advantages of this disclosure will be or may become apparent to one with skill in the art upon examination of the following drawings and detailed description. It is intended that all such additional systems, methods, features and/or advantages be included within this description and be within the scope of the present disclosure.

BRIEF DESCRIPTION OF THE DRAWINGS

The invention is explained in the following description in view of the drawings that show.

DETAILED DESCRIPTION OF THE INVENTION

Figure 1:
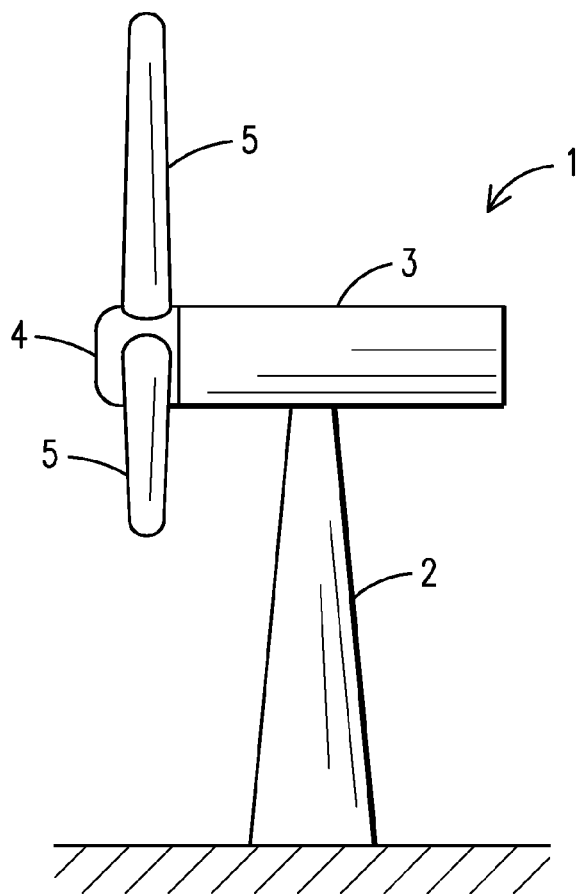
FIG. 1 is a schematic drawing depicting a typical assembled wind turbine.

Systems and methods for testing a yaw system of a wind turbine are provided, several exemplary embodiments of which will be described in detail. In a conventional manner, as shown in FIG. 1, an assembled wind turbine 1 comprises a tower 2, a nacelle 3 and a rotor including a hub 4 with rotor blades 5. The nacelle 3 is rotatably mounted on the tower 2 around a yawing axle (not shown). A yaw control motor (not shown) is located between the tower 2 and the nacelle 3 to yaw the nacelle.

Figure 2:
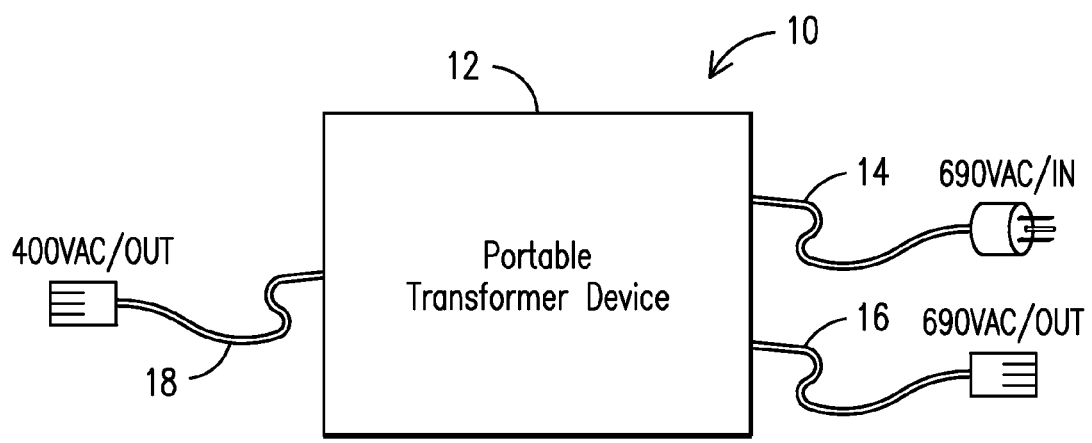
FIG. 2 is a schematic diagram depicting an exemplary embodiment of a system for ground testing a yaw system of a wind turbine.

Referring now in more detail to the drawings, FIG. 2 is a schematic diagram illustrating an exemplary embodiment of a system for ground testing a yaw system of a wind turbine. As shown in FIG. 2, the system comprises a portable transformer device 10 having a case 12, input voltage connection 14 (e.g., 690 VAC), output voltage connection 16 (e.g., 690 VAC), and stepped down output voltage connection 18 (e.g., 400 VAC).

Figure 3:
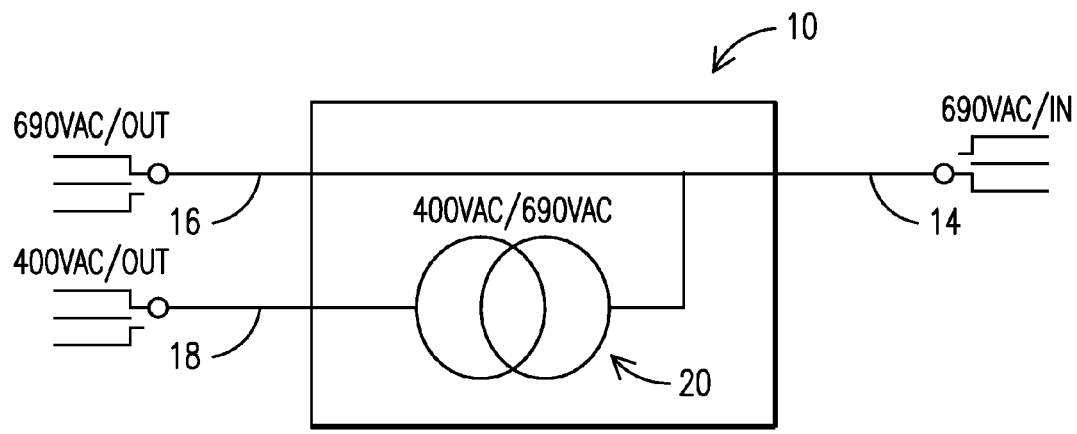
FIG. 3 is a circuit diagram of the transformer of FIG. 2.

Turning now to FIG. 3, an illustration of the transformer circuitry in an exemplary embodiment is shown, having input voltage connection 14 (e.g., 690 VAC/IN), output voltage connection 16 (e.g., 690 VAC/OUT), and stepped down output voltage connection 18 (e.g., 400 VAC/OUT). Stepdown transformer 20 steps down the input voltage from input voltage connection 14 to stepped down output voltage at output voltage connection 18.

Figure 4:
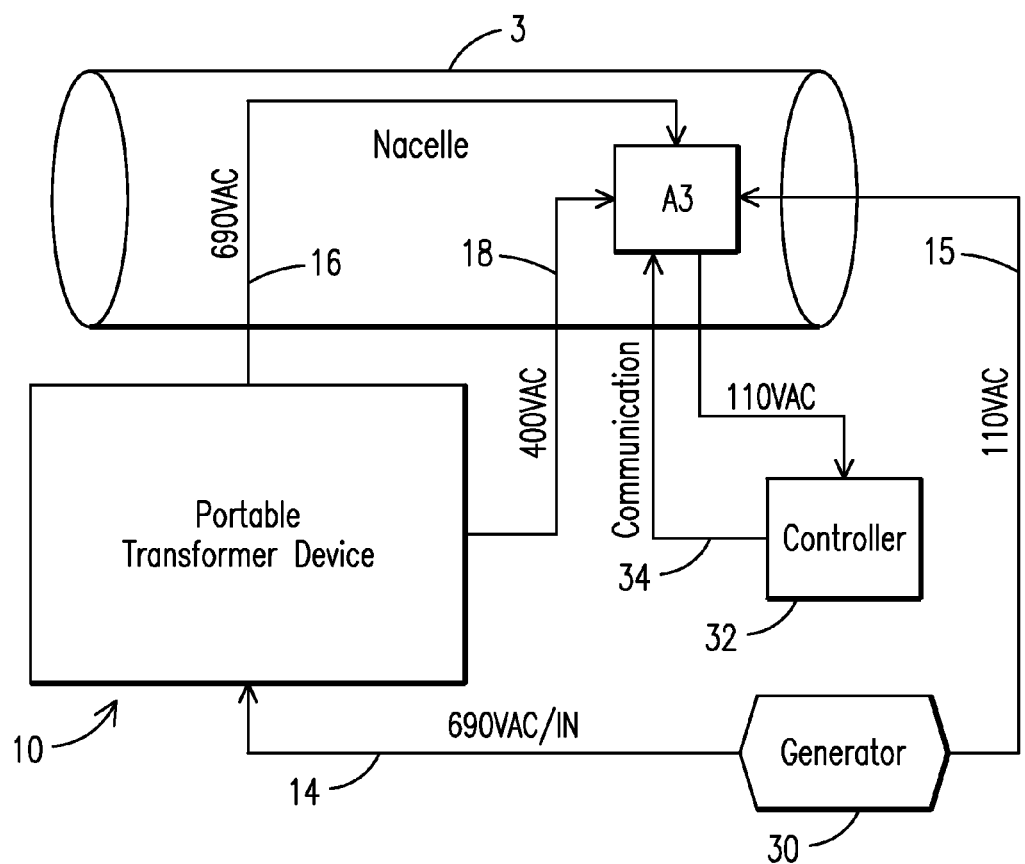
FIG. 4 is a schematic diagram depicting an exemplary embodiment of a system for ground testing a yaw system of a wind turbine of FIG. 2 in use.

FIG. 4 is a schematic diagram depicting an exemplary embodiment of a system for ground testing a yaw system of a wind turbine of FIG. 2 in use. During the yawing process the turbine nacelle 3 is turned around a vertical axis until the rotor axis is, except for a possible vertical tilt angle, parallel to the wind direction. Usually the yaw axis is concentric with the wind turbine tower axis. Yawing is normally carried out by electrical or hydraulic means. The yaw drive unit control is based on a measurement of the wind direction by one or more wind direction sensors placed on the turbine nacelle. A generator 30 (usually 690 VAC trailer) may be on site to supply 690 VAC. It may also supply 110 VAC output voltage 15 for controller devices 32 which control communication through communication link 34 with the nacelle 3. However, the necessary 400 VAC is not provided by the generator 30. The portable transformer device 10 receives input voltage 14 from generator 30. It provides output voltage 690 VAC to the nacelle 3 from connection 16 (e.g., 690 VAC/OUT), and stepped down output voltage 400 VAC to the nacelle 3 from connection 18 (e.g., 400 VAC/OUT). With this portable transformer device 10, all the necessary voltage is now available on the ground for operation/ground testing of the yaw and hydraulic systems while the nacelle 3 is grounded.

Although while on the ground, the nacelle 3 would not necessarily be physically yawed due to the restraints of the nacelle stand, the ground test will provide the ability to visually check the yaw system status lights upon energizing. The portable transformer device 10 also allows verification that the crane is operational.

Figure 5:
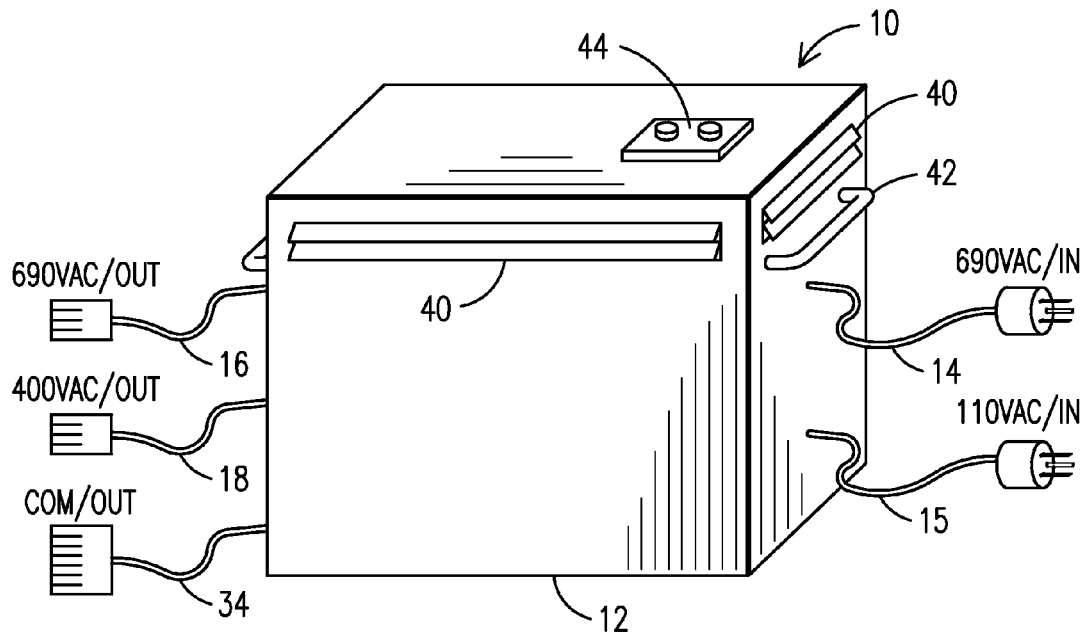
FIG. 5 is a schematic diagram depicting another exemplary embodiment of a system for ground testing a yaw system of a wind turbine.

FIG. 5 is a schematic diagram depicting another exemplary embodiment of a system for ground testing a yaw system of a wind turbine. As shown in FIG. 5, the system comprises a portable transformer device 10 having a case 12, input voltage connection 14 (e.g., 690 VAC), input voltage connection 15 (e.g., 110 VAC), output voltage connection 16 (e.g., 690 VAC), and stepped down output voltage connection 18 (e.g., 400 VAC), and communication link 34 (COM/OUT) from an internal controller (not shown). The case 12 preferably include ventilation 40, a handle for carrying the device 42, and input controls 44 for the yaw controller. The case may further include a locking mechanism (not shown) and any necessary warning labels and the like. Outputs that indicate the yaw is operational may be provided for connection to further devices such as an alarm, a computer, a reporting tool, and the like.

Figure 6:
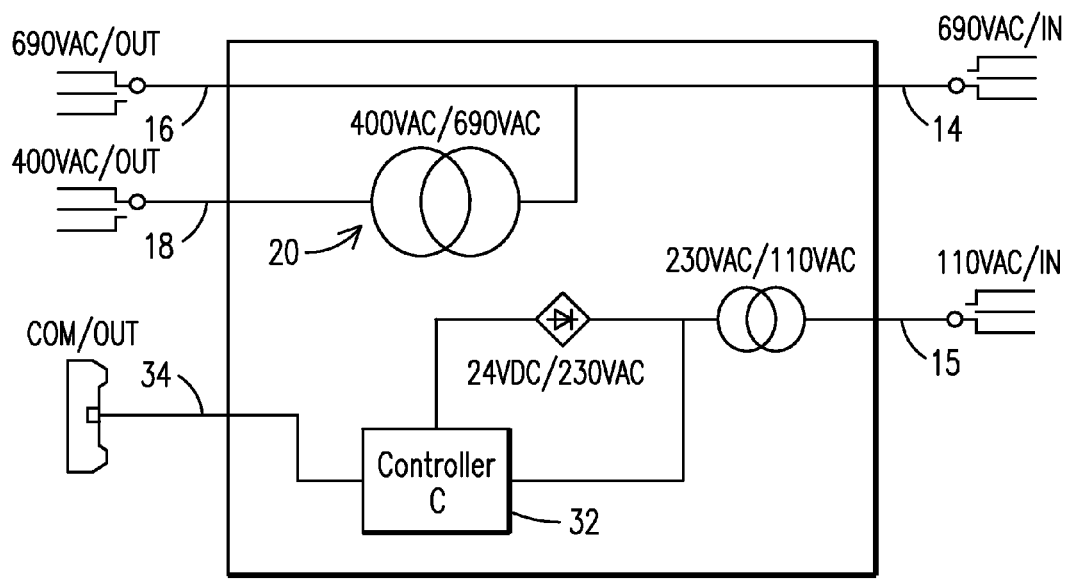
FIG. 6 is a circuit diagram of the transformer of FIG. 5.

FIG. 6 is a circuit diagram of the transformer of FIG. 5, having input voltage connection 14 (e.g., 690 VAC/IN), input voltage connection 15 (e.g., 110 VAC/IN), output voltage connection 16 (e.g., 690 VAC/OUT), and stepped down output voltage connection 18 (e.g., 400 VAC/OUT). Stepdown transformer 20 steps down the input voltage from input voltage connection 14 to stepped down output voltage at output voltage connection 18. A controller 32 is provided in the device 10 which receives 110 VAC and provides the communication link 34 (COM/OUT).

Figure 7:
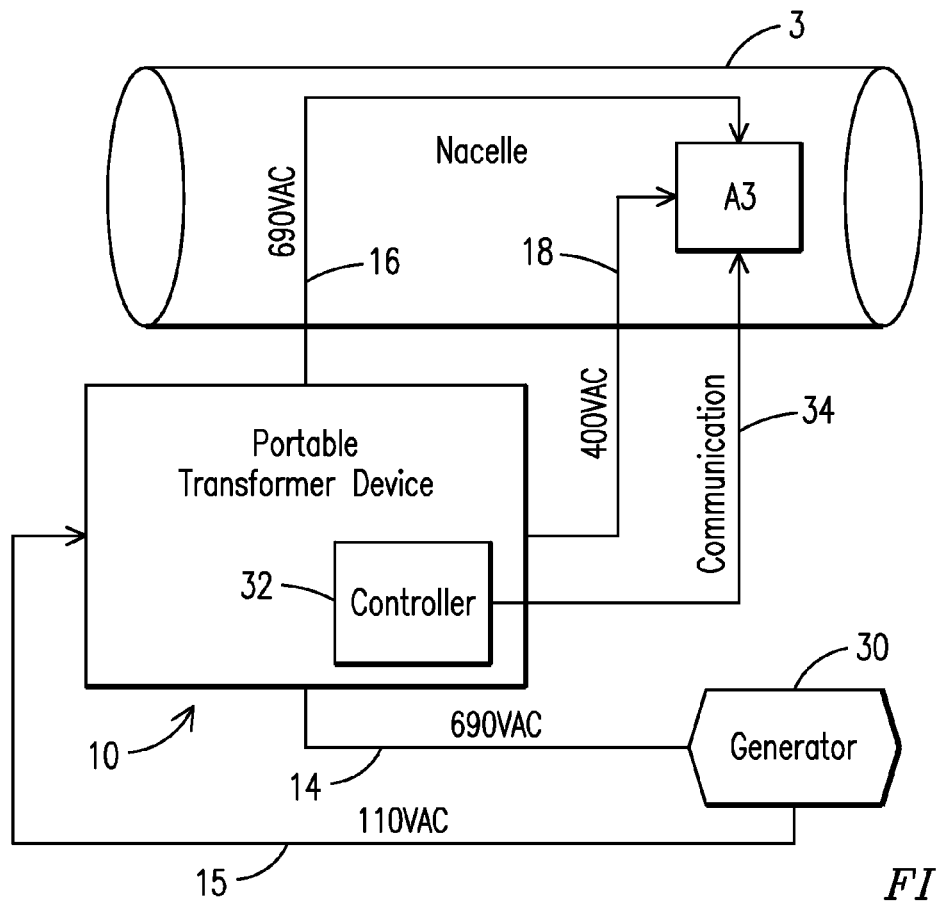
FIG. 7 is a schematic diagram depicting an exemplary embodiment of a system for ground testing a yaw system of a wind turbine of FIG. 5 in use.

FIG. 7 is a schematic diagram depicting an exemplary embodiment of a system for ground testing a yaw system of a wind turbine of FIG. 4 in use. A generator 30 (usually 690 VAC trailer) may be on site to supply 690 VAC. It may also supply 110 VAC output voltage 15 for controller devices 32 which control communication through communication link 34 with the nacelle 3. However, the necessary 400 VAC is not provided by the generator 30. The portable transformer device 10 receives input voltage 14 from generator 30. It provides output voltage 690 VAC to the nacelle 3 from connection 16 (e.g., 690 VAC/OUT), and stepped down output voltage 400 VAC to the nacelle 3 from connection 18 (e.g., 400 VAC/OUT). A controller 32 is provided in the device 10 which receives 110 VAC and provides the communication link 34 (COM/OUT). With this portable transformer device 10, all the necessary voltage is now available on the ground for operation/ground testing of the yaw and hydraulic systems while the nacelle 3 is grounded.

Figure 8:
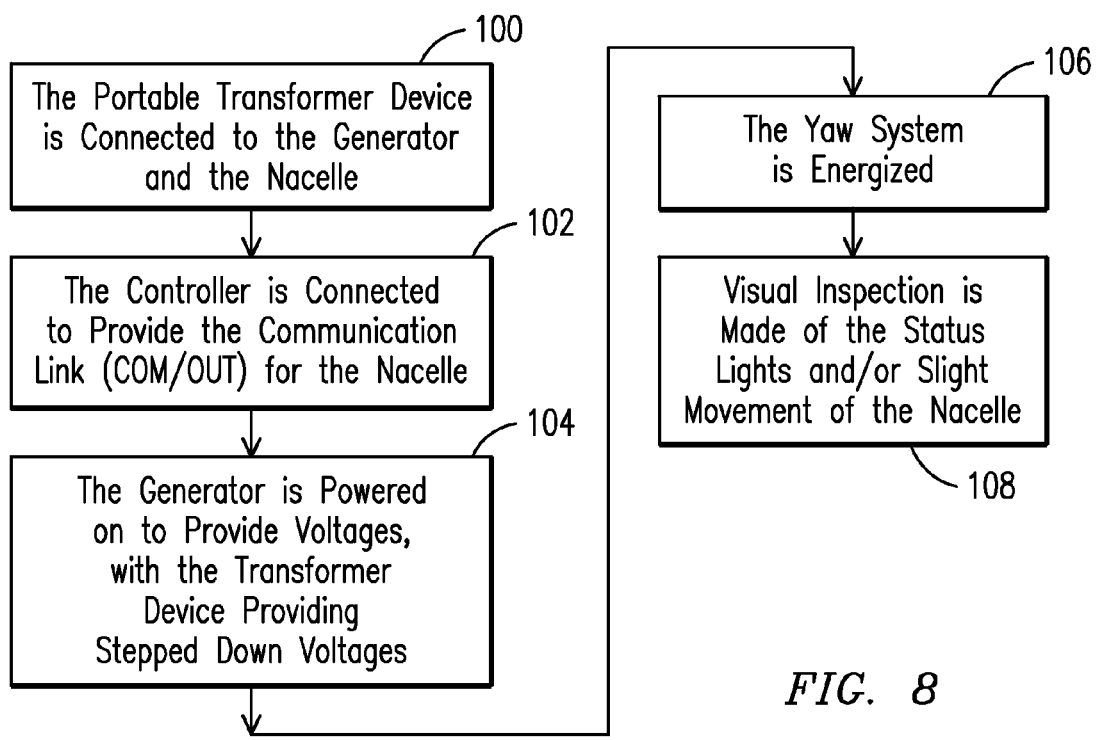
FIG. 8 is a flow diagram illustrating the steps of the testing method of the invention.

With reference to FIG. 8, a ground testing method for a yaw system of a wind turbine 1 according to an embodiment of the invention is shown. In this embodiment, the yaw system is used in a wind turbine system 1. The testing method includes the following steps 100 to 140.

The nacelle prep team provides a generator trailer with 690 VAC. The portable transformer device 10 is connected to the generator 30 and the nacelle 3 in step 100. A controller 32 is provided separate from or as part of the device 10 which receives 110 VAC and provides the communication link 34 (COM/OUT) for the nacelle 3 in step 102. The generator is powered on and the portable transformer device 10 receives input voltage 14 from generator 30. It provides output voltage 690 VAC to the nacelle 3 from connection 16 (e.g., 690 VAC/OUT), and stepped down output voltage 400 VAC to the nacelle 3 from connection 18 (e.g., 400 VAC/OUT) in step 104. With this portable transformer device 10, all the necessary voltage is now available on the ground for operation/ground testing of the yaw and hydraulic systems while the nacelle 3 is grounded. Upon energizing in step 106, the yaw system can be tested by a visual inspection of the status lights in step 108. The nacelle attempting to yaw with slight movement may also be observed in step 108. This is sufficient to confirm operation of the device before erection.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A method for ground testing a yaw system for driving a nacelle of a wind turbine prior to mounting the nacelle on a tower, the ground testing to determine whether the yaw system is operational, the ground testing comprising the following steps:
   (a) connecting a portable transformer device to a generator for supplying voltage on the ground, the generator having a first output voltage provided by a first output voltage connection, wherein an input voltage connection of the portable transformer device is connected to the first output voltage connection of the generator, and wherein the portable transformer device provides a second output voltage by a second output voltage connection equal to the first output voltage of the generator and a third stepped down output voltage by a third stepped down output voltage connection;
   (b) connecting the second output voltage connection of the portable transformer device and the third stepped down output voltage connection to the nacelle of the wind turbine;
   (c) connecting a controller to the nacelle for controlling a yaw system of the nacelle;
   (d) powering on the generator to provide the first output voltage from the generator;
   (e) receiving by the portable transformer device the first output voltage from the generator, providing the first output voltage of the generator to the second output voltage connection and stepping down the first output voltage from the generator to provide the third stepped down output voltage connection to the nacelle of the wind turbine;
   (f) energizing the yaw system, such that the yaw system receives the second output voltage and the third stepped down output voltage from the portable transformer device; and
   (g) outputting an indication to status lights of the yaw system to indicate that the yaw system is operational in view of movement thereof, the testing performed prior to mounting the nacelle on the tower.

2. The method of claim 1 wherein the first input voltage is approximately 690 VAC, the second output voltage is approximately 690 VAC, and the third stepped down output voltage is approximately 400 VAC.

3. The method of claim 1, wherein the generator provides 690 VAC.

4. The method of claim 3 further comprising connecting an output signal that indicates that the yaw system is operational to a reporting device.

5. The method of claim 3 further comprising connecting an output signal that indicates that the yaw system is operational to an alarm device.

6. The method of claim 3 further comprising visually inspecting the status lights to confirm that the yaw system is operational.

7. The method of claim 3 further comprising visually inspecting the nacelle for movement to confirm that the yaw system is operational.

8. The method of claim 3 further comprising receiving an indication of movement of the nacelle to confirm that the yaw system is operational.

* * * * *